United States Patent
Carter et al.

(10) Patent No.: US 8,417,081 B2
(45) Date of Patent: Apr. 9, 2013

(54) ORGANIC ELECTROLUMINESCENT OPTOCOUPLERS

(75) Inventors: Julian Carter, Dry Drayton (GB); Jonathan Halls, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 12/305,189

(22) PCT Filed: Jun. 19, 2007

(86) PCT No.: PCT/GB2007/002272
§ 371 (c)(1),
(2), (4) Date: Jan. 19, 2009

(87) PCT Pub. No.: WO2007/148066
PCT Pub. Date: Dec. 27, 2007

(65) Prior Publication Data
US 2009/0129724 A1    May 21, 2009

(30) Foreign Application Priority Data

Jun. 19, 2006 (GB) .................................. 0612069.5

(51) Int. Cl.
*G02B 6/10* (2006.01)
*H01L 27/15* (2006.01)
*H01L 29/267* (2006.01)
*H01L 31/12* (2006.01)
*H01L 33/00* (2010.01)

(52) U.S. Cl.
USPC ............ 385/131; 257/E51.018; 257/E27.117; 257/81

(58) Field of Classification Search .................. 385/131; 257/E51.018, E51.026, E27.117, 81
See application file for complete search history.

(56) References Cited

U.S. PATENT DOCUMENTS

| 4,539,507 | A  | 9/1985 | VanSlyke et al. |
| 4,769,292 | A  | 9/1988 | Tang et al. |
| 5,512,654 | A  | 4/1996 | Holmes et al. |
| 6,509,574 | B2 | 1/2003 | Yuan et al. |

(Continued)

FOREIGN PATENT DOCUMENTS

| GB | 2368455   | 5/2002  |
| JP | 632694692 | 11/1988 |

(Continued)

OTHER PUBLICATIONS

International Preliminary Report on Patentability for PCT/GB2007/002272 dated Jan. 8, 2009.

(Continued)

*Primary Examiner* — Ryan Lepisto
*Assistant Examiner* — Robert Tavlykaev
(74) *Attorney, Agent, or Firm* — Marshall, Gerstein & Borun LLP

(57) ABSTRACT

An optocoupler including: a substrate comprising a photodetector; a transparent electrically-insulating layer disposed over the photodetector; and an organic electroluminescent device having an organic electroluminescent layer disposed between a first and a second electrode disposed over the transparent electrically-insulating layer; the photodetector arranged to detect light emitted from the organic electroluminescent device; wherein the optocoupler comprises a second current path between the first and second electrodes in addition to a first current path between the first and second electrode which in operation causes the organic electroluminescent layer to emit light.

15 Claims, 3 Drawing Sheets

U.S. PATENT DOCUMENTS

| | | | |
|---|---|---|---|
| 7,151,281 B2* | 12/2006 | Shei et al. | 257/79 |
| 7,683,383 B2* | 3/2010 | Hong et al. | 257/84 |
| 2002/0027206 A1* | 3/2002 | Yuan et al. | 250/551 |
| 2005/0179375 A1* | 8/2005 | Kim et al. | 313/506 |
| 2007/0030611 A1* | 2/2007 | Cho et al. | 361/58 |

FOREIGN PATENT DOCUMENTS

| | | |
|---|---|---|
| JP | 2003-108071 | 4/2003 |
| WO | WO-90/13148 | 11/1990 |
| WO | WO-95/06400 | 3/1995 |
| WO | WO-99/48160 A1 | 9/1999 |
| WO | WO-00/55927 | 9/2000 |

OTHER PUBLICATIONS

Great Britian Search Report for GB0612069.5 dated Oct. 11, 2006.

International Search Report and Written Opinion for PCT/GB2007/002272 dated Oct. 9, 2007.

Bernius et al., "Progress with Light-Emitting Polymers," *Adv. Materials*, 12:1737-1750 (2000).

Bharathan et al., "Polymer electroluminescent devices processed by inkjet printing: I. Polymer light-emitting logo," *Appl. Phys. Lett.*, 72:2660-2662 (1998).

Chang et al., "Dual-color polymer light-emitting pixels processed by hyrid inkjet printing," *Appl. Phys. Lett.*, 73:2561-2563 (1998).

Grice et al., "High brightness and efficiency blue light-emitting polymer diodes,", *Appl. Phys. Lett*, 73:629-631 (1998).

Hebner et al., "Ink-jet printing of doped polymers for organic light emitting devices," *Appl. Phys. Lett.*, 72:519-521 (1998).

Nakanotani et al., "Injection and Transport oof High Current Density Over 1000 A/CM2 in Organic Light Emitting Diodes Under Pulse Excitation," *JP Jr. Applied Physics, JP Society Applied Physics*, 44:3659-3662 (Jun. 2005).

Service, "Self-Assembled LEDs Shine Brightly," *Science*, 279:1135 (1998).

* cited by examiner

ORGANIC ELECTROLUMINESCENT OPTOCOUPLERS

BACKGROUND OF THE INVENTION

1. Field of the Invention

This invention relates to optocouplers, in particular to optocouplers incorporating organic electroluminescent devices.

2. Related Technology

Organic light emitting diodes (OLEDs) comprise a particularly advantageous form of light-emitting device. They are easy and cheap to fabricate on a variety of substrates. Organic (which here includes organometallic) LEDs may be fabricated using either polymers or small molecules in a range of colours, depending upon the materials used. Examples of polymer-based OLEDs are described in WO 90/13148, WO 95/06400 and WO 99/48160; examples of so called small molecule based devices are described in U.S. Pat. No. 4,539,507.

At their most basic, organic electroluminescent devices generally comprise an organic light emitting material which is positioned between a hole injecting electrode and an electron injecting electrode. The hole injecting electrode (anode) is typically a transparent tin-doped indium oxide (ITO)-coated glass substrate. The material commonly used for the electron injecting electrode (cathode) is a low work function metal such as calcium or aluminium.

The materials that are commonly used for the organic light emitting layer include conjugated polymers such as poly-phenylene-vinylene (PPV) and derivatives thereof (see, for example, WO-A-90/13148), polyfluorene derivatives (see, for example, A. W. Grice, D. D. C. Bradley, M. T. Bernius, M. Inbasekaran, W. W. Wu, and E. P. Woo, *Appl. Phys. Lett.* 1998, 73, 629, WO-A-00/55927 and Bernius et al., *Adv. Materials*, 2000, 12, No. 23, 1737), polynaphthylene derivatives and polyphenanthrenyl derivatives; and small organic molecules such as aluminium quinolinol complexes (Alq3 complexes: see, for example U.S. Pat. No. 4,539,507) and quinacridone, rubrene and styryl dyes (see, for example, JP-A-264692/1988). The organic light emitting layer can comprise mixtures or discrete layers of two or more different emissive organic materials.

Typical device architecture is disclosed in, for example, WO-A-90/13148; U.S. Pat. No. 5,512,654; WO-A-95/06400; R. F. Service, *Science* 1998, 279, 1135; Wudl et al., *Appl. Phys. Lett.* 1998, 73, 2561; J. Bharathan, Y. Yang, *Appl. Phys. Lett.* 1998, 72, 2660; T. R. Hebner, C. C. Wu, D. Marcy, M. L. Lu, J. Sturm, *Appl. Phys. Lett.* 1998, 72, 519); and WO 99/48160; the contents of which references are incorporated herein by reference thereto.

The injection of holes from the hole injecting layer such as ITO into the organic emissive layer is controlled by the energy difference between the hole injecting layer work function and the highest occupied molecular orbital (HOMO) of the emissive material, and the chemical interaction at the interface between the hole injecting layer and the emissive layer. The deposition of high work function organic materials on the hole injecting layer, such as poly(styrene sulfonate)-doped poly(3,4-ethylene dioxythiophene) (PEDOT/PSS), N,N'-diphenyl-N,N'-(2-naphthyl)-(1,1'-phenyl)-4,4'-diamine (NBP) and N,N'-bis(3-methylphenyl)-1,1'-biphenyl-4,4'-diamine (TPD), provides "hole transport" layers which facilitate the hole injection into the light emitting layer, transport holes stably from the hole injecting electrode and obstruct electrons. These layers are effective in increasing the number of holes introduced into the light emitting layer.

We will now describe a basic structure of a typical OLED. A glass or plastic substrate supports a transparent anode layer comprising, for example, indium tin oxide (ITO) on which is deposited a hole transport layer, an electroluminescent layer, and a cathode. The electroluminescent layer may comprise, for example, a PPV (poly(p-phenylenevinylene)) and the hole transport layer, which helps match the hole energy levels of the anode layer and electroluminescent layer, may comprise a conductive transparent polymer, for example PEDOT:PSS (polystyrene-sulphonate-doped polyethylene-dioxythiophene) from Bayer AG of Germany. The cathode layer typically comprises a low work function metal such as calcium or barium and may include an additional layer immediately adjacent the electroluminescent layer, such as a layer of lithium fluoride, for improved electron energy level matching. Contact wires connected to the anode and the cathode respectively provide a connection to a power source. The same basic structure may also be employed for small molecule devices.

In general, OLEDs consist of a multi-layer sandwich of indium-tin-oxide (ITO) as anode contact, one or more organic layers including a light emitting polymer (LEP) layer, and a metal layer as cathode, deposited on a planar substrate, usually of glass or a high refractive index plastic such as polycarbonate. In so-called "bottom emitter" devices, the multi-layer sandwich is deposited on the front surface of a planar glass substrate, with the reflecting electrode layer, usually the cathode, furthest away from the substrate, whereby light generated internally in the LEP layer is coupled out of the device through the substrate. We will describe an example of a bottom emitter, where light is emitted through transparent anode and substrate and the cathode is reflective. Conversely, in a so-called "top emitter", the multi-layer sandwich is disposed on the back surface of the substrate, and the light generated internally in the LEP layer is coupled externally through a transparent electrode layer without passing through the substrate. Usually the transparent electrode layer is the cathode, although devices which emit through the anode may also be constructed. The cathode layer can be made substantially transparent by keeping the thickness of cathode layer less than around 50-100 nm, for example.

Organic electroluminescent devices may be advantageously employed in optocouplers, as described, for example, in U.S. Pat. No. 6,509,574. Previously, optocouplers employed inorganic light-emitting diodes. Commercial light emitting diodes (LEDs) typically constitute a p-n junction of inorganic, doped semiconducting materials such as gallium arsenide (GaAs) or aluminium gallium arsenide (AlGaAs). At these junctions between the doped layers, recombination of electrons and holes results in interband emission of light.

Heteroepitaxial growth of direct bandgap III-V compound semiconductors such as GaAs, InP, and GaP on silicon substrates, from which LEDs can be fabricated, yields highly defective material due to mismatches in lattice parameters and thermal expansion coefficients. These LEDs do not perform well, and the silicon circuits are affected during the heteroepitaxy due to the required high growth temperatures (typically >600° C.). Further, achieving good electrical isolation is not easy in these approaches.

As an alternative, III-V LEDs have been integrated with a silicon drive circuit at the package level. But these approaches are expensive and not suitable for wafer-level integration.

Recently, organic light-emitting diodes (OLEDs) have drawn much attention, especially for emissive display applications. Since OLEDs can be fabricated on any smooth surface, such as silicon wafers, and at low (<100° C.) temperatures, they are also very promising for many optoelectronic applications.

FIG. 1 shows an OLED optocoupler according to the prior art. An optocoupler, or optoisolator, is a coupling device in which a light-emitting diode, energized by the input signal, is optically coupled to a photodetector, such as a light-sensitive output diode, transistor or silicon-controlled rectifier. In FIG. 1, the optocoupler, generally designated 100, is constructed on a semiconductor substrate 101. The semiconductor material can be silicon, silicon germanium, gallium arsenide or any other semiconducting material used in photolithographic manufacturing. Integral to substrate 101 is an integrated circuit (not shown in FIG. 1) and a semiconductor device 102 sensitive to electromagnetic radiation in a certain wavelength range. The radiation-sensitive device 102 is frequently referred to as photodetector.

Laying over photodetector 102 is a flat portion of an optically transparent, electrically insulating layer 103, which has first surface 103a and second surface 103b. The radiation-sensitive device 102 is integral with second surface 103b, and the organic diode 104, operable to emit electromagnetic radiation, is integral with the first surface 103a. The radiation-emitting diode is commonly referred to as OLED (organic light-emitting diode). Consequently, photodetector 102 is electrically isolated from OLED 104 and positioned in the path of the emitted radiation.

However, the input current to an optocoupler incorporating an OLED emitting device may not necessarily be the correct value to produce the optimum OLED current.

For a particular device with a standard specified output current (for example 1 mA), the standard specified input current (for example 1 mA) may be too high for the OLED. Driving OLEDs at above their rated currents leads to reductions in device lifetime, at a rate approximately proportional to the square of the driving current. Increasing the device area increases the cost of the device, but reducing the device area (and increasing the brightness of the OLED) reduces the signal to noise ratio, as well as reducing the lifetime of the device. For a given standard input current and output current for an optocoupler, the input current may be too high for the optimum size of OLED.

SUMMARY OF THE INVENTION

We will describe the control of current through the OLED device by the use of the OLED device architecture (an alternative method would be to limit current using silicon circuitry). An advantage of this method is that it allows a standard input current to the optocoupler to be used without having additional circuitry on either the input (which would limit the device's applicability) or on the detector silicon.

According to an aspect of the present invention there is provided an optocoupler including: a substrate comprising a photodetector; a transparent electrically-insulating layer disposed over the photodetector; and an organic electroluminescent device having an organic electroluminescent layer disposed between a first and a second electrode disposed over the transparent electrically-insulating layer; the photodetector arranged to detect light emitted from the organic electroluminescent device; wherein the optocoupler comprises a second current path between the first and second electrodes in addition to a first current path between the first and second electrodes which in operation causes the organic electroluminescent layer to emit light.

By incorporating leakage paths within the device structure the optimum current can be delivered to the OLED. This may also provide enhanced lifetime for the OLED.

Preferably, the second current path is parallel to the first current path.

Preferably the substrate is a semiconductor substrate, more preferably silicon. The photodetector is preferably a light-sensitive semiconductor device comprising a transistor such as an opto-transistor, a diode such as an opto-diode, or any other suitable semiconductor device (e.g. thyristor, triac, silicon-controlled rectifier etc). Preferably the transparent electrically insulating layer is an optical waveguide and more preferably comprises an oxide layer such as silicon dioxide.

Preferably the organic electroluminescent device comprises an organic light-emitting diode (OLED), more preferably a bottom-emitter OLED, although top-emitting types may also be used. Preferably the organic electroluminescent device comprises a multi-layered structure, and the second current path comprises at least one layer of the multi-layered structure. For example, the organic electroluminescent device may comprise a hole transport layer (e.g. PEDOT:PSS), and the second current path may be fabricated from the same material in the same fabrication step.

Alternatively the second current path may comprise interlayer material, or a combination of these and/or other layers. Depending on the layers used, the second current path may have resistive and/or diode-like electrical characteristics. The organic electroluminescent device may comprise bank material, for example photoresist, and the second current path may be formed by opening up the bank and providing a hole or window in the bank for the second current path.

The electrical characteristics of the second current path may be configured to meet a particular specification, such as 1 mA output current at 1 mA input current. More generally, the relationship between the output current and the input current may be linear, for example 1:1.

According to another aspect of the present invention there is provided an optocoupler comprising a substrate bearing a light sensitive semiconductor device, an electrically-insulating layer disposed over the light-sensitive semiconductor device to conduct light to the light-sensitive semiconductor device, a first electrically-conducting layer disposed over the electrically-insulating layer, an organic electroluminescent layer disposed over a first part of said first electrically-conducting layer and a resistive layer disposed over a second part of said first electrically-conducting layer, and a second electrically-conducting layer disposed over the organic electroluminescent layer and the resistive layer.

According to a further aspect of the present invention there is provided an optocoupler comprising a substrate bearing a light sensitive semiconductor device, an electrically-insulating layer disposed over the light-sensitive semiconductor device to conduct light to the light-sensitive semiconductor device, a first electrically-conducting layer disposed over the electrically-insulating layer, an organic electroluminescent layer disposed over a first part of said first electrically-conducting layer, and a second electrically-conducting layer disposed over the organic electroluminescent layer and over a second part of said first electrically-conducting layer.

According to a yet further aspect of the present invention there is provided a method of fabricating an optocoupler, the method comprising fabricating a substrate comprising a photodetector; depositing a transparent electrically-insulating layer over the photodetector; and forming an organic electroluminescent device having an organic electroluminescent layer disposed between a first and a second electrode disposed over the transparent electrically-insulating layer; the photodetector arranged to detect light emitted from the organic electroluminescent device; wherein the method includes: forming a second current path between the first and second electrodes in addition to a first current path between the first and second electrodes which in operation causes the organic electroluminescent layer to emit light.

According to a further aspect of the present invention there is provided a method of optocoupling an input current to an output current, the method comprising driving an organic electroluminescent device with a portion of said input current to emit light, receiving said light at an inorganic semiconductor light-sensitive device to generate said output current, and shunting excess input current through an alternative current path to a current path through said organic electroluminescent device.

A further method of fabricating an optocoupler includes fabricating a substrate comprising a photodetector; depositing a transparent electrically-insulating layer over the photodetector; forming a first electrode layer; patterning the first electrode layer; depositing an organic electroluminescent layer over the first electrode layer; forming a second current path between the first electrode and a second electrode formed over the organic electroluminescent layer in addition to a first current path between the first and second electrodes which in operation causes the organic electroluminescent layer to emit light.

BRIEF DESCRIPTION OF THE DRAWINGS

These and other aspects of the present invention will now be described in detail, with reference to the accompanying Figures, in which.

DETAILED DESCRIPTION

We will describe an example of an optocoupler that is specified 1 mA input and 1 mA output. If we use an OLED device with an internal quantum efficiency 8.3% and an out-coupling efficiency of 60% which we may reasonably expect for this kind of device then an output of 1 mA is achieved with only 0.35 mA of input current. Without any form of sinking the additional current the OLED will be overdriven by a factor of three—resulting in a decrease in lifetime of up to a factor of 10. By sinking 0.65 mA the OLED can be driven at its optimum condition to deliver the required output.

Figure 1:
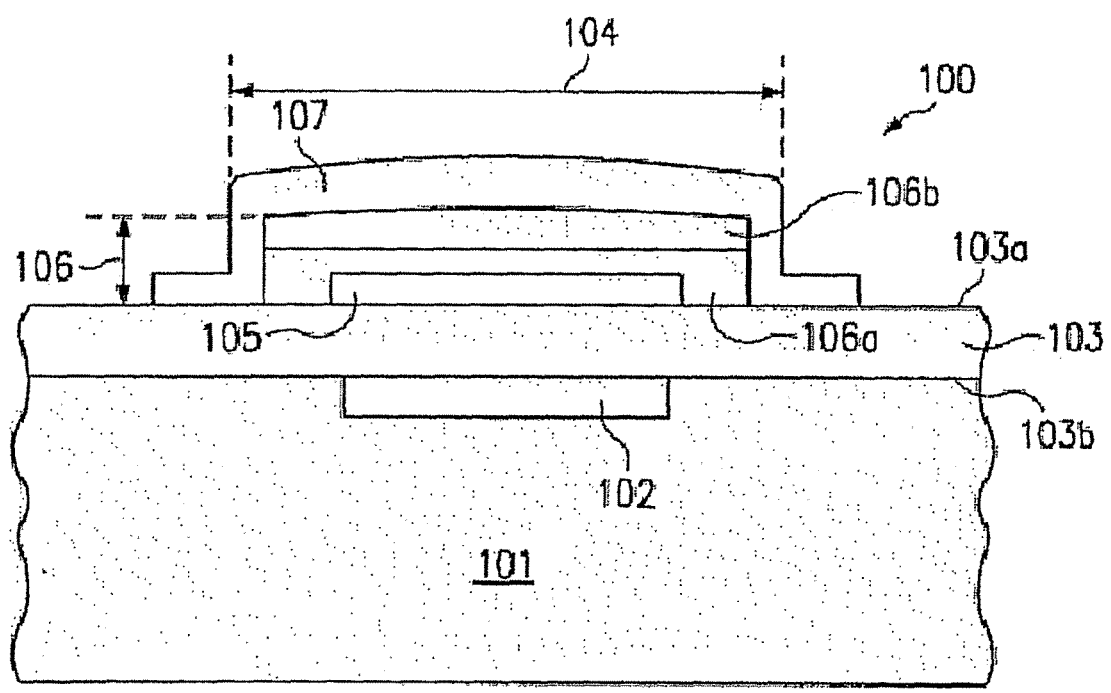
FIG. 1 shows an OLED optocoupler of this prior art.
Figure 2A:
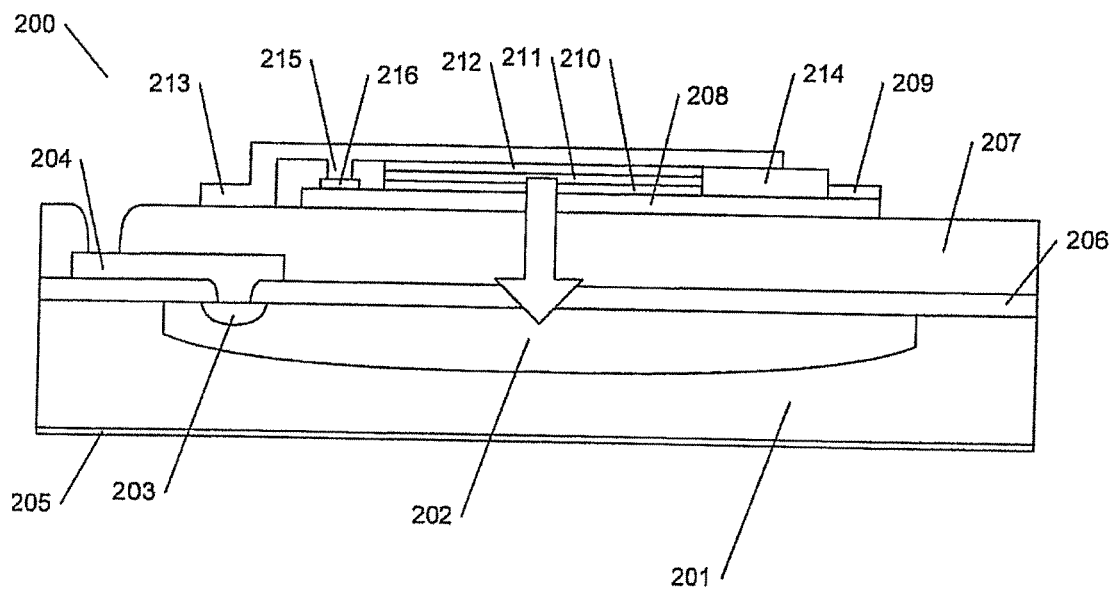
FIG. 2a shows a cross-section view of an optocoupler incorporating an organic light-emitting diode according to an aspect of the present invention.
Figure 2B:
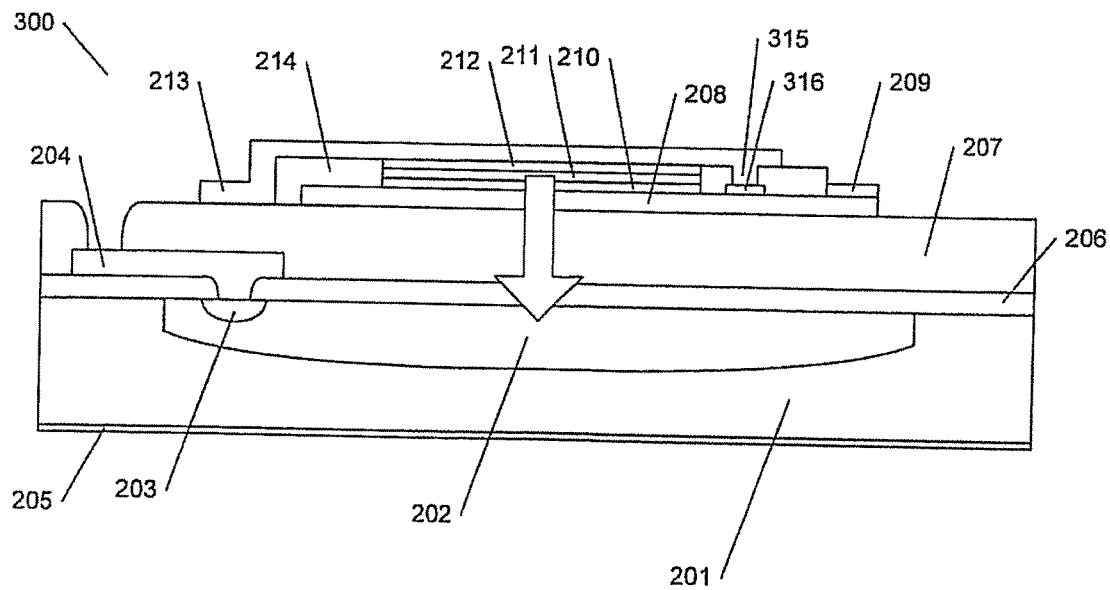
FIG. 2b shows a cross-section view of an alternative optocoupler incorporating an organic light-emitting diode according to an aspect of the present invention.

FIGS. 2a and 2b illustrate an optocoupler 200 incorporating an alternative current path for the excess current. In this example the OLED provided is a bottom-emitter type, although it will be apparent to those skilled in the art that top-emitter OLEDs could also be provided. The OLED is configured to emit light through the anode, but OLEDs may also be provided which emit light through the cathode.

An N-type silicon substrate 201 has a p-type well 202 forming the base of a light-sensitive phototransistor into which light from an organic light-emitting diode may pass. N+ region 203 forms the emitter of the transistor and bond wires may be connected to emitter connection 204. Silicon substrate 201 forms the collector of the transistor and contact metal 205 deposited on the underside of the substrate forms the collector connection. Collector and emitter connections together form the output side of the optocoupler; in alternative embodiments these may comprise anode and cathode connections of a photodiode; more generally input and output connections of a semiconductor device.

Insulating layers 206 and 207 provide electrical isolation between the phototransistor and the OLED. These may be made of silicon nitride, silicon dioxide, silicon oxynitride or any other suitable insulating material known in the art. Electrical isolation may be provided in excess of 1 kV, making the optocoupler useful for interfacing between low voltage control circuits and high voltage power devices in a variety of applications. Insulating layer 206 may be deposited and patterned before emitter connection 204 is made, and insulating layer 207 may be deposited afterwards.

Anode material 208 may comprise a transparent conductor such as indium tin oxide (ITO). This is deposited on the top surface of insulating layer 207. Anode contact 209 may comprise a metal such as aluminium. This is useful for making bond wire connections to the anode. OLED layers 210, 211 and 212 are exemplary of a typical OLED layer structure. There must be one light-emitting polymer layer; other layers which may be present may comprise one or more of hole transport layers, electron transport layers and interlayers. Cathode material 213 may comprise a low work function metal such as aluminium, barium or calcium. This may be deposited on top of the OLED layer structure and bank material 214 (for example photoresist).

By opening the bank it is possible to create parallel current paths around the OLED device. The resistance of the parallel path may be controlled both by dimensions and by the use of PEDT:PSS and interlayer.

Thus, cathode metal 215 and OLED layer material 216 form a current path in parallel with the OLED to provide an alternative path for current to flow from the anode to the cathode. This path may be resistive in terms of its current-voltage characteristic or it may have diode-like characteristics similar to the OLED, depending upon the choice of materials for 216. Optionally 216 may comprise more than one layer, and it may also comprise materials not used in the OLED layer structure—but in this example OLED materials because they may be deposited in the same process steps used to fabricate the OLED (i.e. additional processing steps are not required).

For example, by using hole transport layer material such as PEDOT:PSS, a resistive parallel current path may be formed. The resistance of this path may be controlled by adjusting the dimensions of the structure, for example the thickness of the layer or the area. Area may be controlled at mask level, whereas thickness may be controlled during the fabrication process.

Alternatively, by using hole transport layer material and interlayer material, or interlayer by itself, a parallel current path with a diode-like characteristic may be formed. The parameters of this path may be controlled by adjusting the dimensions of the structures, and by adjusting the doping of (e.g.) the hole transport layer. Other combinations of OLED layer materials may also be employed.

The dimensions may be controlled to achieve a specified output current for a specified input current—for example 1 mA output current at 1 mA input current. The characteristics of the alternative current path may be controlled to achieve one particular current specification or they may be controlled over a range of input currents and output currents. The parallel current path may be ohmic, that is to say it may have a substantially constant resistance over a range of input currents and temperatures, or it may have a different characteristic. One series of characteristics with particular advantages is the series of characteristics proportional to the organic light-emitting diode characteristic. Thus, over a range of input currents to the optocoupler, the current through the alternate current path may be proportional to the current through the OLED.

The alternative current path may be provided at any point between the anode and the cathode, and it need not be provided in one place. FIG. 2b shows an alternative optocoupler 300 having a different location for the alternative current path 315 and 316, and it will be apparent to those skilled in the art that it could equally well be provided in both places or anywhere else between the anode and cathode. Furthermore, the Figures show cross-sections of the optocoupler; it will be appreciated that optocouplers according to the present invention may be three-dimensional structures, and the parallel current path may also be provided in different places in the axis perpendicular to the page.

Figure 3:
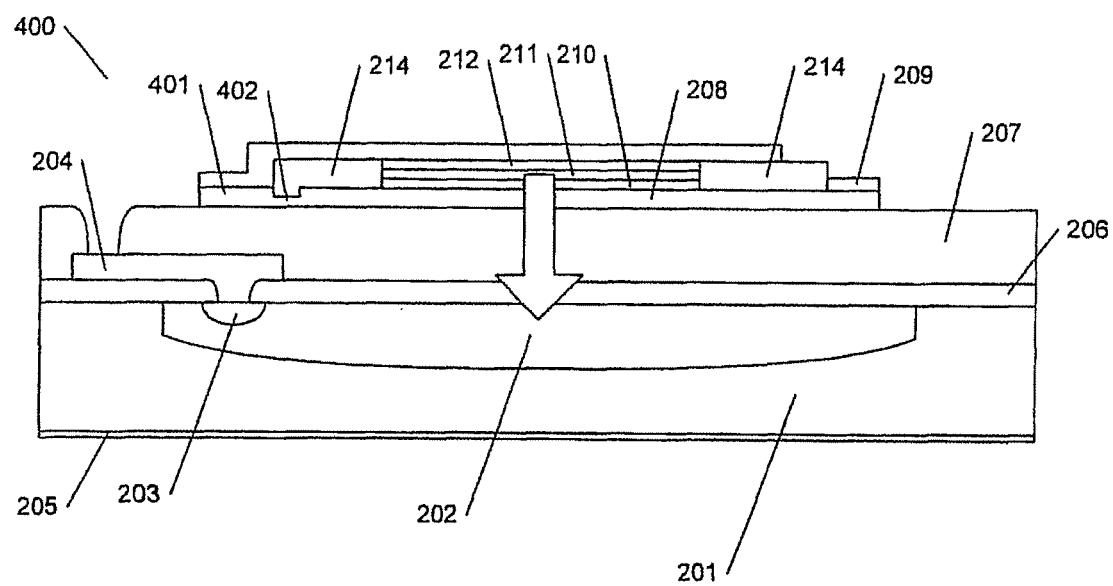
FIG. 3 shows a cross-section view of an optocoupler incorporating an organic light-emitting diode according to another aspect of the present invention; and, FIG. 4 shows a plan view of an indium tin oxide (ITO) layer of an optocoupler incorporating an organic light-emitting diode according to another aspect of the present invention.

In addition the resistance may also be controlled by etching ITO features on the anode. FIG. 3 shows an optocoupler 400 according to this embodiment of the invention. Anode material 208 is extended underneath the cathode contact 401, and a feature 402 is provided between the anode and the material under the cathode contact. This is shown diagrammatically in FIG. 3 as being thinner than the rest of the ITO material, but it may advantageously comprise the same thickness, as it may be formed in the same process step as the rest of the ITO material.

Figure 4:
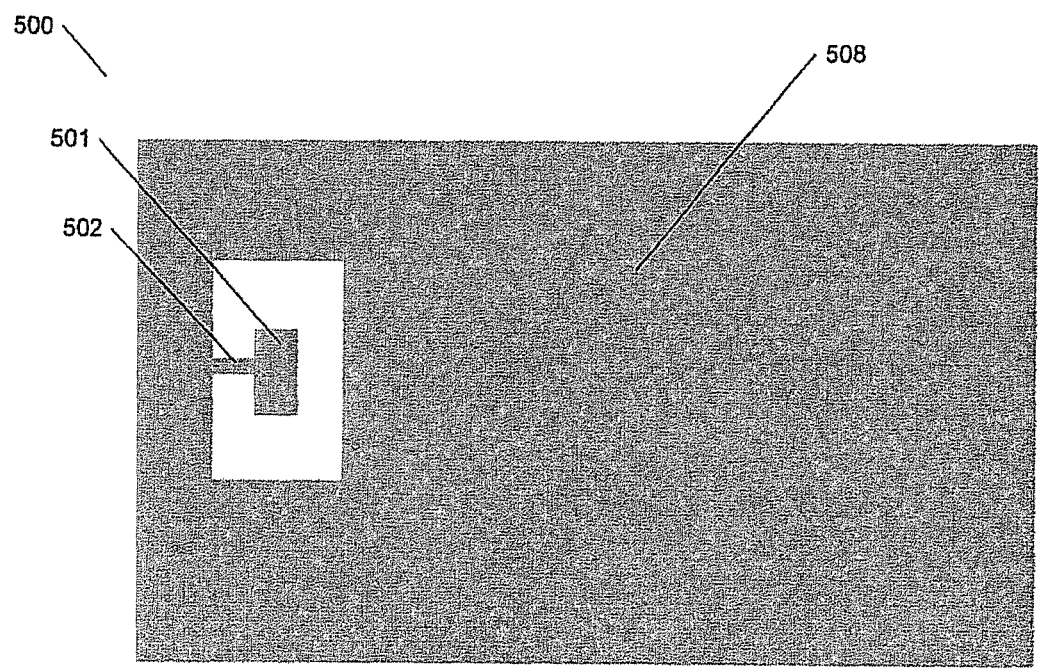

FIG. 4 shows a plan view. By opening up the bank to the contact pad the resistance from cathode to anode contact can be limited by the resistance defined by the ITO geometry. The Figure shows a contact pad with current limiting etched ITO feature. The ITO layer 500 comprises anode material 508, material 501 under the cathode and alternate current path feature 502. The dimensions of this feature may be controlled to vary the resistance. An exemplary resistance that may be obtained using this feature is 40 ohms.

No doubt alternatives will occur to the skilled person. It will be understood that the invention is not limited to the described embodiments and encompasses modifications apparent to those skilled in the art lying within the spirit and scope of the claims appended hereto.

The invention claimed is:

1. An optocoupler including:
a substrate comprising a photodetector;
a transparent electrically-insulating layer disposed over the photodetector; and
an organic electroluminescent device having an organic electroluminescent layer and at least one of an interlayer and a hole transport layer disposed between a first electrode and a second electrode, the organic electroluminescent device disposed over the transparent electrically-insulating layer; the photodetector arranged to detect light emitted from the organic electroluminescent device;
wherein the optocoupler comprises a second current path between the first and second electrodes in addition to a first current path between the first and second electrodes, the first current path causing the organic electroluminescent layer to emit light and the second current path comprising at least one of the hole transport layer and the interlayer of the organic electroluminescent device.

2. An optocoupler according to claim 1, wherein the second current path is parallel to the first current path.

3. An optocoupler according to claim 1, wherein the photodetector comprises a transistor.

4. An optocoupler according to claim 1, wherein the transparent electrically-insulating layer is an optical waveguide.

5. An optocoupler according to claim 1, wherein the transparent electrically-insulating layer comprises an electrically-insulating oxide layer.

6. An optocoupler according to claim 1, wherein said second current path comprises hole transport layer material.

7. An optocoupler according to claim 1, wherein said second current path comprises interlayer material.

8. An optocoupler according to claim 1, wherein said second current path comprises a resistor.

9. An optocoupler according to claim 1, wherein said second current path comprises a diode.

10. An optocoupler according to claim 1, wherein the organic electroluminescent device further comprises bank material, and wherein said second current path is disposed in a window in said bank material.

11. An optocoupler according to claim 1, wherein the organic electroluminescent device further comprises bank material, and wherein the second current path between the first and second electrodes is formed between adjacent banks not having any electroluminescent layer therebetween.

12. A method of fabricating an optocoupler, the method comprising:
fabricating a substrate comprising a photodetector;
depositing a transparent electrically-insulating layer over the photodetector; and
forming an organic electroluminescent device having an organic electroluminescent layer and at least one of an interlayer and a hole transport layer disposed between a first electrode and a second electrode, the organic electroluminescent device disposed over the transparent electrically-insulating layer; the photodetector being arranged to detect light emitted from the organic electroluminescent device; wherein the method comprises:
forming a second current path between the first and second electrodes in addition to a first current path between the first and second electrodes, the first current path causing the organic electroluminescent layer to emit light, and the second current path comprising at least one of the hole transport layer and the interlayer of the organic electroluminescent device.

13. A method of fabricating an optocoupler according to claim 12, comprising disposing the organic electroluminescent layer by inkjet printing or spin coating.

14. A method of optocoupling an input current to an output current, the method comprising:
driving an organic electroluminescent device comprising an organic electroluminescent layer and at least one of an interlayer and a hole transport layer with a portion of said input current to emit light;
receiving said light at an inorganic semiconductor light-sensitive device to generate said output current; and
shunting excess input current through an alternate current path to a current path through said organic electroluminescent device, the current path causing the organic electroluminescent layer to emit light, and the alternate current path comprising at least one of the hole transport layer and the interlayer of the organic electroluminescent device.

15. A method of fabricating an optocoupler comprising:
fabricating a substrate comprising a photodetector;
depositing an optical waveguide over the photodetector;

forming a first electrode layer;
patterning the first electrode layer;
depositing an organic electroluminescent layer and at least one of an interlayer and a hole transport layer over the first electrode layer;
forming a second current path between the first electrode and a second electrode formed over the organic electroluminescent layer in addition to a first current path between the first and second electrodes, the first current path causing the organic electroluminescent layer to emit light, and the second current path comprising at least one of the hole transport layer and the interlayer of the organic electroluminescent device.

\* \* \* \* \*

UNITED STATES PATENT AND TRADEMARK OFFICE
CERTIFICATE OF CORRECTION

| | | |
|---|---|---|
| PATENT NO. | : 8,417,081 B2 | |
| APPLICATION NO. | : 12/305189 | |
| DATED | : April 9, 2013 | |
| INVENTOR(S) | : Julian Carter et al. | |

It is certified that error appears in the above-identified patent and that said Letters Patent is hereby corrected as shown below:

On the Title Page:

At item (75), "Dry Drayton" should be -- Cambridgeshire --.

On the Title Page:

The first or sole Notice should read --

Subject to any disclaimer, the term of this patent is extended or adjusted under 35 U.S.C. 154(b) by 160 days.

Signed and Sealed this
Third Day of June, 2014

Michelle K. Lee
*Deputy Director of the United States Patent and Trademark Office*